United States Patent [19]

Seki

[11] Patent Number: 5,365,536
[45] Date of Patent: Nov. 15, 1994

[54] SEMICONDUCTOR LASER

[75] Inventor: Akinori Seki, Toyota, Japan

[73] Assignee: Toyota Jidosha Kabushiki Kaisha, Toyota, Japan

[21] Appl. No.: 93,754

[22] Filed: Jul. 20, 1993

[30] Foreign Application Priority Data

Jul. 20, 1992 [JP] Japan ................................. 4-215580
Dec. 18, 1992 [JP] Japan ................................. 4-356021

[51] Int. Cl.$^5$ .............................................. H01S 3/19
[52] U.S. Cl. ........................................ 372/45; 372/50
[58] Field of Search .......................... 372/45, 50, 43

[56] References Cited

U.S. PATENT DOCUMENTS

| 3,514,715 | 5/1970 | Kosonocky | 372/45 |
| 5,016,252 | 5/1991 | Hamada et al. | 372/45 |
| 5,212,706 | 5/1993 | Jain | 372/50 |

FOREIGN PATENT DOCUMENTS

| 59-167083 | 9/1984 | Japan . |
| 61-247084 | 11/1986 | Japan . |
| 2071574 | 3/1990 | Japan . |

OTHER PUBLICATIONS

J. P. Van Der Ziel et al., "Multilayer GaAs Lasers Separated by Tunnel Junctions, Applied Physics Letters", Sep. 1992, pp. 499-501.

Transient Analysis of p-n-p-n Optoelectronic Devices, IEEE J.Q.E. QE-10 pp. 567-569, Aug. 1992.

CMOS-Compatible Lateral Bipolar Transistor for BiCMOS Technology: Part II-Esperimental Results IEEE T.E.D. vol. 39 No. 8, Aug. 1992, pp. 1858-1864.

Primary Examiner—Georgia Y. Epps
Attorney, Agent, or Firm—Cushman, Darby & Cushman

[57] ABSTRACT

A semiconductor laser for radiating a laser beam when current flows in the forward direction includes a first laser structure, a tunnel diode structure and a second laser structure in sequence, the forward direction of the first laser structure and the second laser structure being coincident with the forward direction of the semiconductor laser, the forward direction of the tunnel diode structure being opposite to the forward direction of the semiconductor laser.

8 Claims, 5 Drawing Sheets

SEMICONDUCTOR LASER

BACKGROUND OF THE INVENTION

1. Field of the Invention

The present invention relates to a semiconductor laser, and more specifically to a high output semiconductor laser having a reduced power consumption and an improved productivity.

2. Description of the Prior Art

There has been known in the art a technique in which an n-type clad layer, an active layer and a p-type clad layer are grown in sequence on a semiconductor substrate to form a laser chip for an oscillating laser beam, and such a prior art technique is disclosed in U.S. Pat. No. 5,016,252, Japanese Laid-Open Patent Publication No. 2-71574, and Japanese Laid-Open Patent Publication No. 61-247084.

There has been also provided a semiconductor laser in which more than two laser chips are stacked to obtain a higher output. An example of such a laser is shown in FIG. 10. The semiconductor laser in FIG. 10 has two laser chips 8 stacked one on the other, with solder 8a provided therebetween to bond the chips 8 to each other.

Each of the semiconductor laser chips 8 is formed by growing in sequence an n-$Al_xGa_{1-x}As$ clad layer 82, an undoped GaAs active layer 83, a p-$Al_xGa_{1-x}As$ clad layer 84 and a p+-GaAs contact layer 85 on an n+-GaAs semiconductor substrate 81. In the drawing, numeral 80 designates an n-side electrode, 87 a p-side electrode and 86 a current blocking layer. When voltage is applied to the electrodes 80 and 87, carriers are injected into the active layer 83 from the clad layers 82 and 84, and recombination of the carriers converts the active layer 83 into a light radiating region.

When such a two-chip stacked semiconductor laser is driven by pulses having a pulse width of 50 ns, a duty ratio of 0.025% and an input current of 25A, a peak output of 30W is obtained.

Stacking of semiconductor laser chips 8 is not limited to the above mentioned two chips but may include more chips, and a device including six chips stacked to obtain a peak output of 100W is commercially available.

However, there are several disadvantages when two or more semiconductor laser chips 8 are stacked with solder 8a interposed therebetween to bond the chips, as described above, such as a defective light radiating pattern due to a poor bonding accuracy, a destruction of the semiconductor laser chips 8 due to thermal damage during the bonding process thereof and an increase of labor cost required in the bonding process of the semiconductor laser chips 8.

Though the n+-GaAs substrate 81 of the semiconductor laser chip 8 has a relatively low specific resistance (about $1 \times 10^{-3}$ Ωcm), the flow of driving current of several tens of amps results in a power consumption of several hundreds of mW caused by the n+-GaAs substrate 81. Thus, stacking of the semiconductor laser chips 8 by means of solder 8a provided therebetween causes the n+-GaAs substrates 81 to be stacked, resulting in an increased power consumption.

SUMMARY OF THE INVENTION

It is a first object of the present invention to provide a laminated semiconductor laser in which the chip bonding process can be eliminated from the manufacturing process of the semiconductor laser.

It is a second object of the present invention to reduce the number of stacked layers of the semiconductor substrate (for example, GaAs substrate) in the laminated semiconductor laser to decrease power consumption.

An arrangement of the semiconductor laser chips 8 directly stacked one on the other without solder and substrate would provide a pnpn-type or npnp-type thyristor structure, and the arrangement is not suitable for a semiconductor laser.

The semiconductor laser in accordance with the present invention radiates a laser beam when current flows in the forward direction, and includes a first laser structure, a tunnel diode structure and a second laser structure grown in sequence, with the forward direction of the first laser structure and the second laser structure being coincident with the forward direction of the semiconductor laser, and with the forward direction of the tunnel diode structure being opposite to the forward direction of the semiconductor laser.

In the semiconductor laser of the present invention, the tunnel diode structure is grown between the first laser structure and the second laser structure grown in sequence, the first and second laser structures being combined by the tunnel diode structure. Furthermore, as the connection is such that the forward direction of each of the laser structures is opposite to the forward direction of the tunnel diode structure, a flow of forward current to the laser structures causes the tunnel diode structure to be biased in the reverse direction. At this time, a Zener effect occurs in the tunnel diode structure, permitting the voltage drop on application of a reverse bias to be reduced, so that the voltage drop in the whole semiconductor laser can be kept within a practical range.

BRIEF DESCRIPTIONS OF THE DRAWINGS

The foregoing and other objects, features, aspects and advantages of the present invention will become more apparent from the following detailed description of the present invention when taken in conjunction with the accompanying drawings, in which.

DETAILED DESCRIPTION OF THE PREFERRED EMBODIMENTS

Now, the embodiments of the present invention will be described with reference to the drawings.

Figure 1:
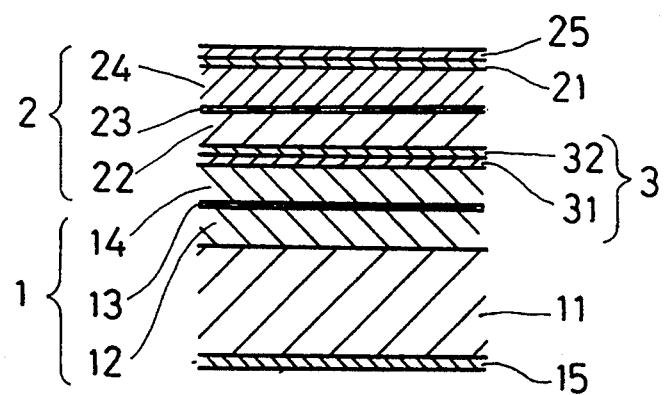
FIG. 1 is a sectional view of a first embodiment of the present invention.

FIG. 1 is a sectional view of a first embodiment of the present invention, in which a first laser structure 1, a tunnel diode structure 3 and a second laser structure 2 are grown in sequence so as to be laminated in monocrystal to form a semiconductor laser device, with the forward direction of the first laser structure 1 being coincident with that of the second laser structure 2, and with the forward direction of the tunnel diode 3 being opposite to that of the laser structures 1, 2.

Specifically, the first laser structure 1 is formed laminating in sequence a first n-type clad layer 12, a first undoped active layer 13 and a first p-type clad layer 14 on a surface of an n-type compound semiconductor substrate 11, and then a tunnel diode structure 3 is formed by laminating in sequence a first p+ junction layer 31 and a second n+ junction layer 32. The second laser structure 2 is formed by laminating in sequence a second n-type clad layer 22, a second undoped active layer 23 and a second p-type clad layer 24, and a p-type contact or cap layer 21 is further laminated thereon. Then, an n-side electrode 15 is formed on the other surface of the n-type compound semiconductor substrate 11, and a p-side electrode 25 is formed on the p-type contact or cap layer 21 to complete a monocrystal epitaxial laminated compound semiconductor laser.

In the first laser structure 1, electrons are injected from the first n-type clad layer 12 to the first undoped active layer 13, while positive holes are injected from the first p-type clad layer 14 to the first undoped active layer 13. When the injected electrons and positive holes are recombined in the first undoped active layer 13, a laser beam is radiated. Due to a difference in the index of refraction of light between the first undoped active layer 13 and each of the clad layers 12, 14, the laser beam is confined in the first undoped active layer 13. The operation of the second laser structure 2 is the same as the above described operation of the first laser structure 1.

The monocrystal epitaxial laminated compound semiconductor laser is formed by successively growing the first laser structure 1, the tunnel diode structure 3 and the second laser structure 2 on the n-type compound semiconductor substrate 11 by a vapor phase growing method such as a MOVPE (Metal Organic Vapor Phase Epitaxy) and a MBE (Molecular Beam Epitaxy) method.

Figure 2:
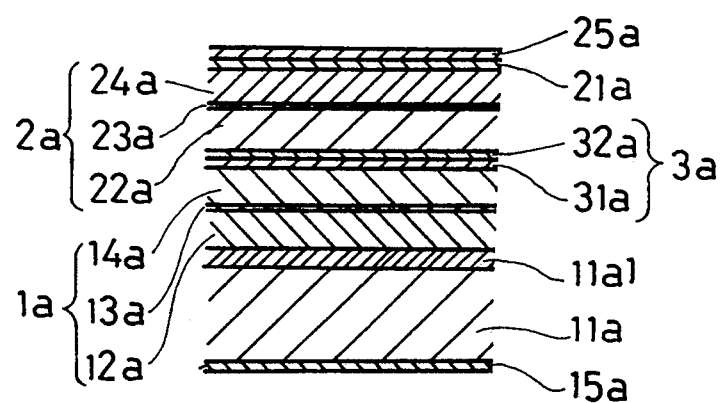
FIG. 2 is a sectional view of a first example of the first embodiment.

FIG. 2 is a sectional view of a first example of the first embodiment. In FIG. 2, the first laser structure 1a is formed at first by growing in sequence a first n-$Al_xGa_{1-x}As$ clad layer 12a, a first undoped GaAs active layer 13a and a first p-$Al_xGa_{1-x}As$ clad layer 14a (Zn, Mg or Be doped, p-type impurity concentration p is about 1 to $10 \times 10^{17}/cm^3$) on an n+-GaAs substrate 11a (Si or Sn doped, n-type impurity concentration n is about 1 to $5 \times 10^{18}/cm^3$) and an n+-GaAs buffer layer 11a1.

The tunnel diode structure 3a is formed by growing in sequence a first p+-GaAs junction layer 31a (p-type impurity concentration p is about $1 \times 10^{18}/cm^3$ or more) and a second n+-GaAs junction layer 32a (n-type impurity concentration n is about $1 \times 10^{18}/cm^3$ or more).

The second laser structure 2a is formed by growing in sequence a second n-$Al_xGa_{1-x}As$ clad layer 22a (n-type impurity concentration n is about 1 to $10 \times 10^{18}/cm^3$), a second undoped GaAs active layer 23a, and a second p-$Al_xGa_{1-x}As$ clad layer 24a. A p+-GaAs contact or cap layer 21a (p-type impurity concentration p is almost 1 to $10 \times 10^{18}/cm^3$) is formed on the second laser structure 2a. The value of the above component ratio x is 0.25 to 0.55.

An evaporator is used to deposit a p-side electrode 25a (lamination of AuZu layer or the like on Au layer) on the contact layer 21a and an n-side electrode 15a (successive lamination of AuGe layer, Ni layer and Au layer or the like) on the n+-GaAs substrate 11a to complete the basic structure of the semiconductor laser.

In the final step of manufacturing the semiconductor laser, prior to formation of the n-side electrode 15a, the n+-GaAs substrate 11a is ground at the lower surface thereof in the drawing so as to have a desired thickness (in the order of 100 μm). The basic structure of the semiconductor laser thus obtained is cleaved in a rectangular form (which is about 350 μm wide, 250 μm deep and 100 μm high), so that a resonator surface of the semiconductor laser is formed on the cleavage plane. The resonator surface is covered with a thin film (not shown) of silicon dioxide ($SiO_2$), amorphous silicon (Si), aluminum oxide ($Al_2O_3$) or the like serving as a protective and reflecting film.

With this construction, the first laser structure 1a and the second laser structure 2a are successively formed in a single vapor phase growing process. Thus, two active layers (light radiating regions) 13a, 23a are formed. There is no need for bonding by solder 8a as was required in the above described prior art. The present invention is effective in achieving the manufacture of high output semiconductor lasers in a higher yield ratio at a lower cost.

Figure 10:
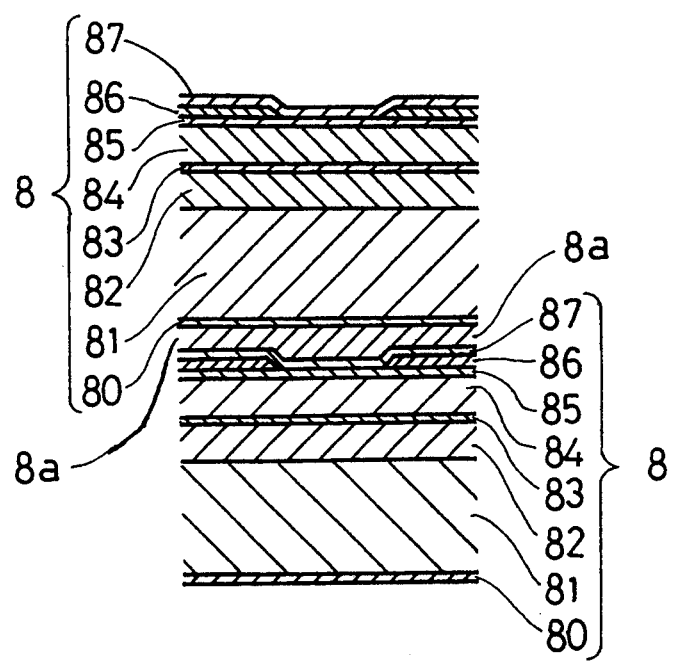
FIG. 10 is a sectional view of a conventional device.

Furthermore, in accordance with the present invention, the n+-GaAs substrate 81 of the upper one of the two semiconductor laser chips 8 bonded together in FIG. 10 can be omitted, resulting in a reduction of power consumption.

The above described laminated structure of the semiconductor laser constitutes a pnpn thyristor. Therefore, when forward current flows to the semiconductor laser, the tunnel diode structure 3a constitutes a reverse-biased p-n junction, but it is rendered conductive by the tunnel current caused by the first p+-GaAs junction layer 31a and the second n+-GaAs junction layer 32a which are thin films of 50 nm or less having a low resistance and a high impurity concentration.

The n+-GaAs buffer layer 11a1 is provided for preventing crystal defects in the n+-GaAs substrate 11a, and it may be eliminated without serious effect on the characteristics of the semiconductor laser.

In the first example of the first embodiment as shown in FIG. 2, an experiment was executed with the respective structures being actually determined numerically, and the resultant characteristics are as follows.

In the first laser structure, the n+-GaAs substrate 11a had an n-type impurity concentration $n = 1 \times 10^{18}/cm^3$, the n+-GaAs buffer layer 11ab had an n-type impurity concentration $n = 1 \times 10^{18}/cm^3$ and a layer thickness of 0.5 μm, the first n-$Al_xGa_{1-x}As$ clad layer 12a had an n-type impurity concentration $n = 1 \times 10^{18}/cm^3$, a layer thickness of 1.5 μm and x=0.3, the first undoped GaAs active layer 13a had a layer thickness of 0.1 μm, and the first p-$Al_xGa_{1-x}As$ clad layer 14a had a p-type impurity concentration $p = 1 \times 10^{18}/cm^3$, a layer thickness of 1.0 μm and x=0.3.

In the tunnel diode structure 3a, the first p+-GaAs junction layer 31a had a p-type impurity concentration $p = 5 \times 10^{18}/cm^3$ and a layer thickness of 10 nm, and the second n+-GaAs Junction layer 32a had an n-type impurity concentration $n=3\times 10^{18}/cm^3$ and a layer thickness of 10 nm.

In the second laser structure 2a, the second n-$Al_xGa_{1-x}As$ clad layer 22a had an n-type impurity concentration $n=1\times 10^{18}/cm^3$, a layer thickness of 1.0 μm and $x=0.3$, the second undoped GaAs active layer 23a had a layer thickness of 0.1 μm, the second p-$Al_xGa_{1-x}As$ clad layer 24a had a p-type impurity concentration $p=1\times 10^{18}/cm^3$, a layer thickness of 1.5 μm and $x=0.3$, and the p+-GaAs contact or cap layer 21a had a p-type impurity concentration $p=5\times 10^{18}/cm^3$ and a layer thickness of 0.5 μm.

Figure 9:
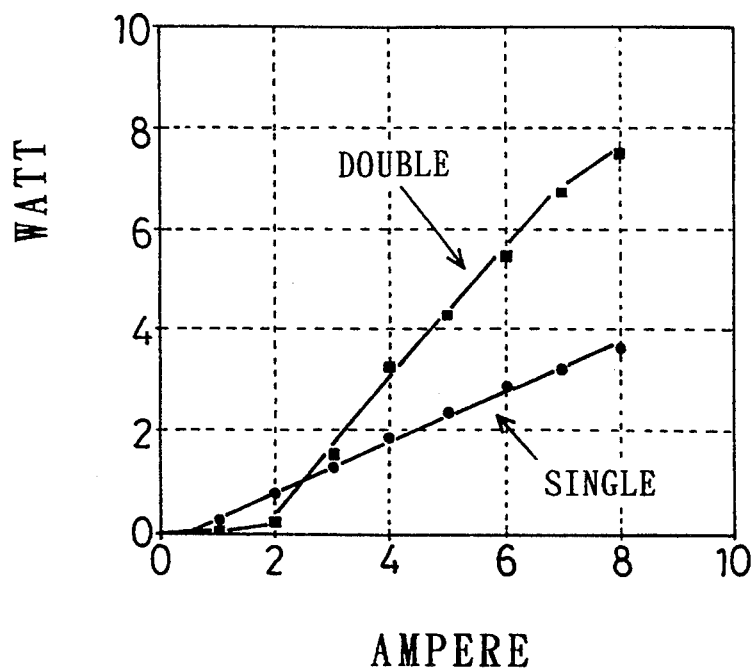
FIG. 9 is a graph illustrating the characteristics of the first example of the first embodiment.

When the experiment was executed based upon the above data, a radiant output characteristic as shown in FIG. 9 was obtained. In FIG. 9, the single layer type laser corresponds to the first laser structure 1a only, and the double layer type laser corresponds to the combination of the first laser structure 1a, the tunnel diode structure 3a and the second laser structure 2a.

TABLE 1

| COMPARISON OF MAXIMUM RADIANT OUTPUT | |
|---|---|
| | Maximum Radiant Output (W) |
| Double Layer Type | 7.5 (I = 8A) |
| Single Layer Type | 3.6 (I = 8A) |

As shown in TABLE 1, the double layer type semiconductor laser in accordance with the present invention generates the maximum radiant output approximately twice greater than that by the single layer type. Thus, it has been recognized that the multilayer arrangement of the laser diode structure using the tunnel diode structure in accordance with the present invention assures an increase of the radiant output or a generation of a higher output.

Figure 3:
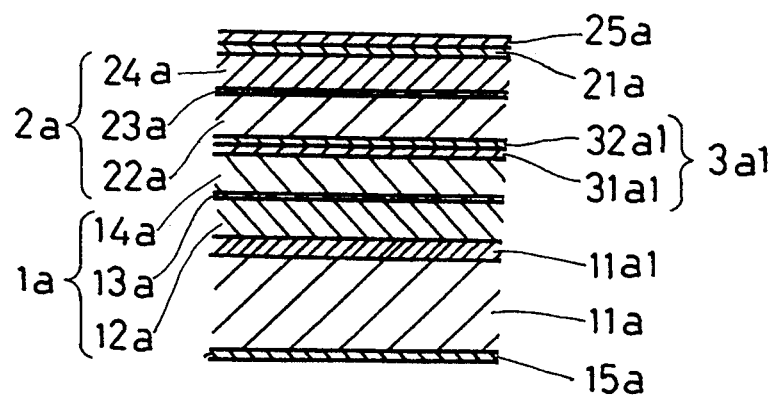
FIG. 3 is a sectional view of a second example of the first embodiment.

FIG. 3 is a sectional view of a second example of the first embodiment. In FIG. 3, the tunnel diode structure 3a1 corresponds to the tunnel diode structure 3a in the first example and the other elements are the same as those in the first example.

Specifically, a first p+-$In_yGa_{1-y}As$ junction layer 31a1 (p-type impurity concentration $p=1$ to $50\times 10^{18}/cm^3$) corresponds to the first p+-GaAs junction layer 31a in the first example, and an n+-$In_yGa_{1-y}As$ junction layer 32a1 (n-type impurity concentration $n=1$ to $50\times 10^{18}/cm^3$) corresponds to the n+-GaAs junction layer 32a in the first example. The component ratio y is a constant value within the range from 0 to 1.

Thus, the first junction layer 31a1 and the second junction layer 32a1 are used in place of the first junction layer 31a and the second junction layer 32a in the first example, respectively.

The $In_yGa_{1-y}As$ layer used as a junction layer has a smaller band gap than GaAs and AlGaAs, resulting in a higher carrier concentration (1 to $50\times 10^{18}/cm^3$), and with the first junction layer 31a1 and the second junction layer 32a1 being biased in the reverse direction, a Zener effect will be readily obtainable from the tunnel current, causing the operational voltage and consequently the power consumption to be lowered.

Figure 4:
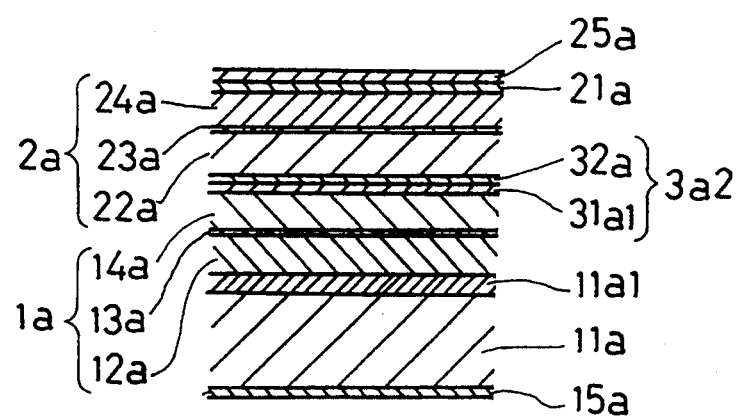
FIG. 4 is a sectional view of a third example of the first embodiment.

FIG. 4 is a sectional view of a third example of the first embodiment. In FIG. 4, the respective elements are the same as the corresponding ones in the first example, except a tunnel diode structure 3a2 which is different from the tunnel diode structure 3a in the first example.

Specifically, the tunnel diode structure 3a2 comprises a first p+-$In_yGa_{1-y}As$ junction layer 31a1 corresponding to the first p+-GaAs junction layer 31a in the tunnel diode structure 3a of the first example and the second n+-GaAs junction layer 32a which is the same as that in the first example. Thus, only the first junction layer 31a1 is used example. Thus, only the first junction layer 31a1 is used in place of the first junction layer 31a in the first example. In this example, the power consumption can also be lowered by the first junction layer 31a1.

Figure 5:
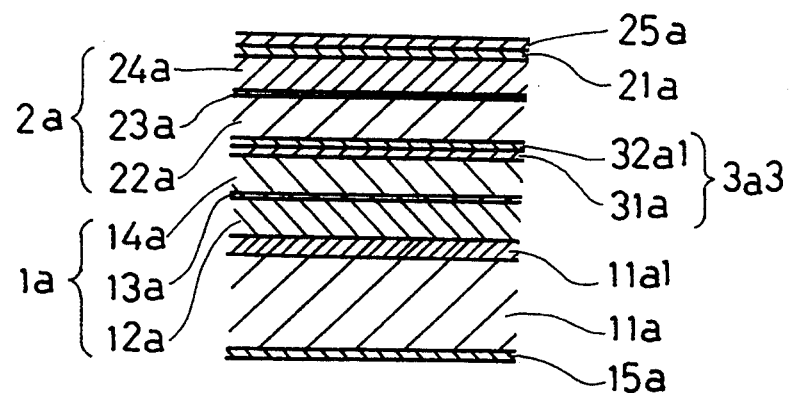
FIG. 5 is a sectional view of a fourth example of the first embodiment.

FIG. 5 is a sectional view of a fourth example of the first embodiment. In FIG. 5, the respective elements are the same as the corresponding ones in the first example, except a tunnel diode structure 3a3 which is different from the tunnel diode structure 3a in the first example.

Specifically, the tunnel diode structure 3a3 comprises a second n+-$In_yGa_{1-y}As$ junction layer 32a1 corresponding to the second n+-GaAs junction layer 32a in the tunnel diode structure 3a of the first example and the first p+-GaAs junction layer 31a which is the same as that in the first example. Thus, only the second junction layer 32a1 is used in place of the second junction layer 32a in the first example. In this example, the power consumption can also be lowered by the second junction layer 32a1.

Though the $In_yGa_{1-y}As$ layer used as the junction layer 31a1 or 32a1 in FIGS. 3 to 5 has a constant value for y, the value of y may be changed gradually and successively from 0 to 1 in the junction layer 31a1 from the lowermost end side thereof in the drawing toward the upper side to form a graded structure, and also it may be changed gradually and successively from 1 to 0 in the second junction layer 32a1 from the lowermost end side thereof in the drawing toward the upper side. In such a structure, the composition is successively changed, restricting the generation of crystal defects and barriers due to an incontinuity of the band structure, and the resultant reduction of the operating voltage permits the power consumption to be lowered.

Figure 6:
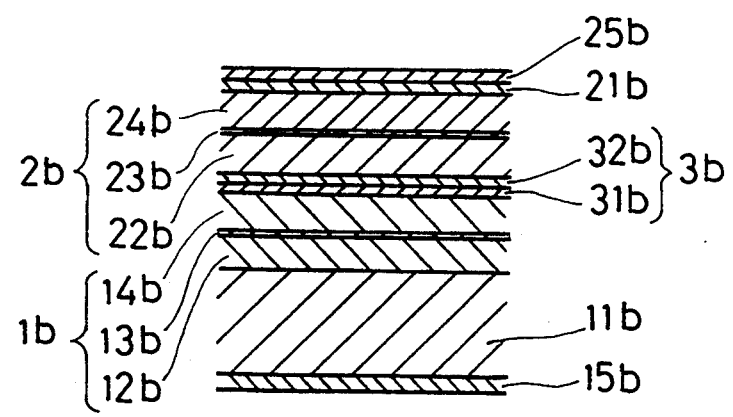
FIG. 6 is a sectional view of a fifth example of the first embodiment.

FIG. 6 is a sectional view of a fifth example of the first embodiment. In FIG. 6, a first laser structure 1b is at first formed by growing in sequence a first n-InP clad layer 12b, a first undoped $In_xGa_{1-x}As_yP_{1-y}$ active layer 13b and a first p-InP clad layer 14b on an n+-Inp substrate 11b.

A tunnel diode structure 3b is formed by growing in sequence a first p+-InP junction layer 31b (p-type impurity concentration p is about 1 to $1\times 10^{18}/cm^3$ and thickness is less than 50 nm) and a second n+-InP junction layer 32b (n-type impurity concentration n is about 1 to $1\times 10^{18}/cm^3$ and thickness is less than 50 nm).

A second laser structure 2b is formed by growing in sequence a second n-InP clad layer 22b (n-type impurity concentration n is about 1 to $5\times 10^{17}/cm^3$), a second undoped $In_xGa_{1-x}As_yP_{1-y}$ active layer 23b, a second p-InP clad layer 24b and a p+-Inp contact or cap layer 21b. In this case, the above component ratio x is in the range from 0 to 1 and y is also in the range from 0 to 1.

An evaporator is used to deposit a p-side electrode 25b on the contact layer 21b and an n-side electrode 15b on the n+-InP substrate 11b to complete the basic structure of the semiconductor laser. The wavelength of the laser beam radiated from the semiconductor laser is 1.3 or 1.5 μm.

Figure 7:
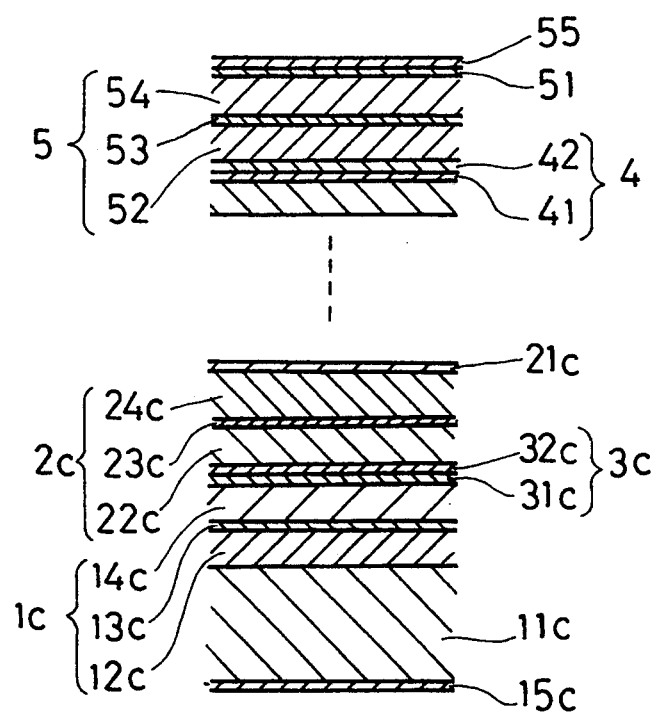
FIG. 7 is a sectional view of a second embodiment of the present invention.

FIG. 7 is a sectional view of a second embodiment of the present invention. In FIG. 7, in the vapor phase growing method for forming the semiconductor laser, the step of growing in sequence a first laser structure 1c, a first tunnel diode structure 3c and a second laser structure 2c is followed by another step of growing in sequence additional tunnel diode structures such as a K-1-th tunnel diode structure 4 and a K-th laser structure 5 to achieve a high output semiconductor laser having a plurality of radiant layers, for example, of three, four or any desired number K (K=2, 3 . . . ) stacked in lamination.

The first laser structure 1c is formed by laminating in sequence on a surface of an n-type compound semiconductor substrate 11c a first n-type clad layer 12c, a first undoped active layer 13c and a first p-type clad layer 14c. The first tunnel diode structure 3c is formed by laminating in sequence a first p+ junction layer 31c and a second n+junction layer 32c, and then the second laser structure 2c is formed by laminating in sequence a second n-type clad layer 22c, a second undoped active layer 23c, a second p-type clad layer 24c and a p-type contact or cap layer 21c. Following the lamination of the above layers, the K-1-th tunnel diode structure 4 is formed by laminating in sequence a first p+ junction layer 41 and a second n+ junction layer 42, and then the K-th laser diode structure 5 is formed by laminating in sequence a K-th n-type clad layer 52, a K-th undoped active layer 53, a K-th p-type clad layer 54 and a p-type contact or cap layer 51. 15c designates an n-side electrode and 55 designated a p-side electrode.

Figure 8:
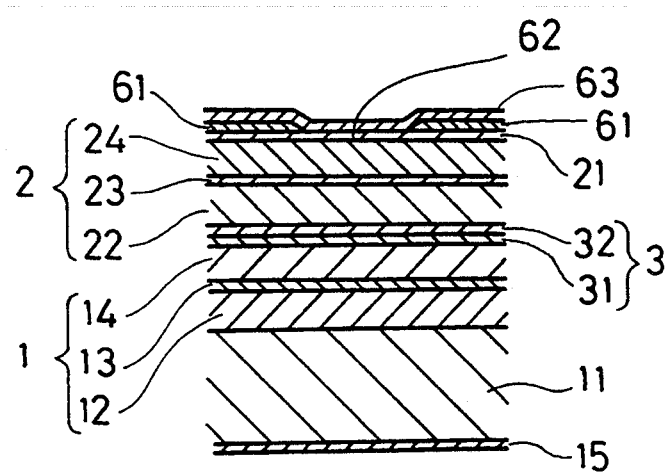
FIG. 8 is a sectional view of a practical semiconductor laser using the first embodiment.

FIG. 8 is a sectional view of a practical semiconductor laser using the first embodiment. In FIG. 8, a current blocking layer 61 is provided to restrict current to flow through the central portion 62 of the semiconductor laser so as to obtain an improved radiant efficiency which permits provision of a high output semiconductor laser in the drawing, 63 designates a p-side electrode.

As described above, the present invention provides a semiconductor laser device in which a higher output is obtainable with no need of bonding a plurality of semiconductor laser chips by solder. This assures an improvement of a product yield and productivity of high-output semiconductor lasers.

Furthermore, in order to obtain a high output semiconductor laser, the semiconductor laser structures can be laminated by an epitaxial growth method on a single compound semiconductor substrate, permitting a decrease of power consumption due to the omission of an additional substrate.

Although in the above embodiments, GaAs or InGaAsP is used for an active layer, the present invention is not limited to them but other materials such as AlGaAs, AlInGaP and AlGaP may be used to form such an active layer. Although, GaAs, InGaAs or InP is used to form a tunnel diode in the above embodiments, the present invention is not limited to them but other materials such as AlGaAs may be used to form such a tunnel diode.

Furthermore, lamination is made on the n-type substrate in the above embodiments, but it is also possible to convert n-type to p-type to laminate the first laser structure, the tunnel diode and the second laser structure on a p-type substrate.

What is claimed is:

1. A semiconductor laser for radiating a laser beam when current flows in a forward direction, said semiconductor laser comprising:
a semiconductor substrate;
a first laser structure formed on said semiconductor substrate and having a forward direction coincident with said forward direction of said semiconductor laser;
a tunnel diode structure formed on said first laser structure and having a forward direction that is opposite to said forward direction of said semiconductor laser, said tunnel diode structure including:
a first p-type junction layer, and
a second n-type junction layer formed on said first p-type junction layer, and
a second laser structure formed on said tunnel diode structure and having a forward direction coincident with said forward direction of said semiconductor laser;
wherein said first and second junction layers are formed of a material selected from a group including GaAs, InGaAs and InP; and
wherein said first and second junction layers have an impurity concentration of at least $1 \times 10^{18}/cm^3$ and a layer thickness of no more than 50 nm.

2. The semiconductor laser as defined in claim 1, wherein at least one of said first and second junction layers is formed of InGaAs.

3. The semiconductor laser as defined in claim 2, wherein said InGaAs layer has an impurity concentration of $1 \times 10^{18}/cm^3$.

4. The semiconductor laser as defined in claim 1, wherein said first and second junction layers are formed of $In_yGa_{1-y}As$, and the value of the component ratio y in said first junction layer gradually increases toward said second junction layer, and the value of the component ratio y in said second junction layer gradually increases toward said first junction layer.

5. The semiconductor laser as defined in claim 1, wherein:
said semiconductor substrate is n-type;
said first laser structure comprises:
i) a first n-type clad layer,
ii) a first active layer formed on said first n-type clad layer, and
iii) a first p-type clad layer formed on said first active layer, and
said second laser structure comprises:
i) a second n-type clad layer,
ii) a second active layer formed on said second n-type clad layer, and
iii) a second p-type clad layer formed on said second active layer.

6. The semiconductor laser as defined in claim 5, wherein said semiconductor substrate is formed of a material selected from a group including GaAs and InP.

7. The semiconductor laser as defined in claim 5, wherein said first and second active layers are formed of a material selected from a group including GaAs and InGaAsP.

8. A semiconductor laser for radiating a laser beam when current flows in a forward direction, comprising:
a p-type semiconductor substrate;
a first laser structure formed on said semiconductor substrate and having a forward direction coincident with said forward direction of said semiconductor laser, said first laser structure comprising:
i) a first p-type clad layer,
ii) a first active layer formed on said first p-type clad layer, and
iii) a first n-type clad layer formed on said first active layer,
a tunnel diode structure formed on said first laser structure and having a forward direction that is opposite to said forward direction of said semiconductor laser, said tunnel diode structure including:

a first n-type junction layer, and a second p-type junction layer formed on said first n-type junction layer, and a second laser structure formed on said tunnel diode structure and having a forward direction coincident with said forward direction of said semiconductor laser, said second laser structure comprising:

i) a second p-type clad layer, ii) a second active layer formed on said second p-type clad layer, and iii) a second n-type clad layer formed on said second active layer, wherein said first and second junction layers are formed of a material selected from a group including GaAs, InGaAs and InP; and wherein said first and second junction layers have an impurity concentration of at least $1 \times 10^{18}/cm^3$ and a layer thickness of no more than 50 nm.

* * * * *